United States Patent
Katagiri

(10) Patent No.: US 10,786,851 B2
(45) Date of Patent: Sep. 29, 2020

(54) COATED CUTTING TOOL

(71) Applicant: TUNGALOY CORPORATION, Fukushima (JP)

(72) Inventor: Takao Katagiri, Iwaki (JP)

(73) Assignee: TUNGALOY CORPORATION, Iwaki-shi, Fukushima (JP)

( * ) Notice: Subject to any disclaimer, the term of this patent is extended or adjusted under 35 U.S.C. 154(b) by 148 days.

(21) Appl. No.: 16/046,099

(22) Filed: Jul. 26, 2018

(65) Prior Publication Data

US 2019/0030614 A1    Jan. 31, 2019

(30) Foreign Application Priority Data

Jul. 28, 2017 (JP) .................. 2017-147143

(51) Int. Cl.
*B23B 27/14* (2006.01)
*C23C 28/00* (2006.01)
(Continued)

(52) U.S. Cl.
CPC ........ *B23B 27/148* (2013.01); *C23C 14/0021* (2013.01); *C23C 14/022* (2013.01);
(Continued)

(58) Field of Classification Search
USPC .......... 51/307, 309; 428/216, 336, 697, 698, 428/699
See application file for complete search history.

(56) References Cited

U.S. PATENT DOCUMENTS

| 7,348,074 B2 * | 3/2008 | Derflinger | C23C 28/048 428/699 |
| 2006/0292399 A1 * | 12/2006 | Sjolen | C23C 14/0021 428/698 |

(Continued)

FOREIGN PATENT DOCUMENTS

| EP | 2 591 869 A1 | 5/2013 |
| EP | 3 018 233 A1 | 5/2016 |

(Continued)

*Primary Examiner* — Archene A Turner
(74) *Attorney, Agent, or Firm* — Studebaker & Brackett PC

(57) ABSTRACT

A coated cutting tool comprising a substrate and a coating layer formed on the substrate, wherein:
the coating layer has an alternating laminate structure of an alternating laminate of:
a first composite nitride layer containing a compound having a composition represented by formula (1) below:

$$(Al_{1-x}Cr_x)N \quad (1)$$

(wherein x denotes an atomic ratio of the Cr element based on a total of the Al element and the Cr element and satisfies $0.10 \leq x \leq 0.50$); and
a second composite nitride layer containing a compound having a composition represented by formula (2) below:

$$(Ti_{1-y}Si_y)N \quad (2)$$

(wherein y denotes an atomic ratio of the Si element based on a total of the Ti element and the Si element and satisfies $0.00 < y < 1.00$);
an average thickness of each of the layers of the first composite nitride layer is from 70 nm or more to 300 nm or less, and an average thickness of each of the layers of the second composite nitride layer is from 70 nm or more to 300 nm or less; and (Continued)

a ratio [H/E] of a hardness H of the alternating laminate structure to an elastic modulus E of the alternating laminate structure is from 0.06 or more to 0.08 or less.

20 Claims, 1 Drawing Sheet

(51) Int. Cl.
| | |
|---|---|
| C23C 14/00 | (2006.01) |
| C23C 14/02 | (2006.01) |
| C23C 30/00 | (2006.01) |
| C23C 28/04 | (2006.01) |
| C23C 14/06 | (2006.01) |
| C23C 14/32 | (2006.01) |

(52) U.S. Cl.
CPC ........ *C23C 14/0641* (2013.01); *C23C 14/325* (2013.01); *C23C 28/044* (2013.01); *C23C 28/42* (2013.01); *C23C 28/44* (2013.01); *C23C 30/005* (2013.01); *B23B 2228/10* (2013.01)

(56) References Cited

U.S. PATENT DOCUMENTS

| | | | | |
|---|---|---|---|---|
| 2008/0166583 | A1* | 7/2008 | Astrand | C23C 14/0641 428/602 |
| 2008/0166588 | A1* | 7/2008 | Astrand | C23C 14/0641 428/698 |
| 2012/0090247 | A1* | 4/2012 | Miura | C23C 14/0036 51/309 |
| 2013/0108850 | A1* | 5/2013 | Kudo | C23C 30/005 428/216 |
| 2015/0232978 | A1 | 8/2015 | Schier | |
| 2018/0223436 | A1 | 8/2018 | Schier | |

FOREIGN PATENT DOCUMENTS

| | | | |
|---|---|---|---|
| JP | 2008-188689 | * | 8/2008 |
| JP | 2015-530270 A | | 10/2015 |

* cited by examiner

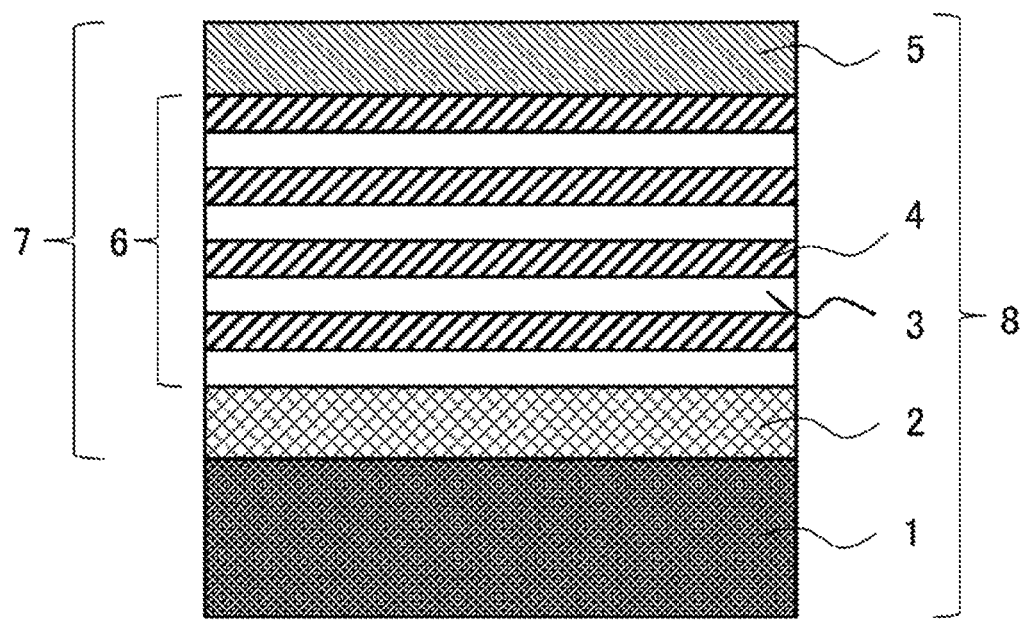

COATED CUTTING TOOL

TECHNICAL FIELD

The present invention relates to a coated cutting tool.

BACKGROUND ART

For the cutting of steel, cast iron, stainless steel, heat-resistant alloys, etc., a surface coated cutting tool has been widely employed which comprises, on a surface of a substrate consisting of cemented carbide, cermet, cubic boron nitride (cBN) or the like, one layer or two or more layers each comprised of a hard coating, such as a TiN film or a TiAlN film.

For example, Patent Document 1 proposes a tool comprising, on a main body made of cemented carbide, cermet, ceramic, steel or high-speed steel, a multilayer wear protection coating including: a layer (A) of TiAlN with a thickness of from 20 nm or more to 3 μm or less; and a layer (B) of a sequence of at least four alternating superposed sublayers of TiSiN and AlCrN with a thickness of the sublayers of from 0.5 nm or more to 15 nm or less.

CITATION LIST

Patent Documents

Patent Document 1: JP2015-530270 T

SUMMARY

Technical Problem

An increase in speed, feed and depth of cut have become more conspicuous in cutting in recent times, and the fracture resistance of a tool is required to be further improved compared to that involved in the prior art. In particular, under the conditions for high-speed machining, cracking occurs in a cutting edge due to a load applied onto a tool during cutting. Such cracking results in the tendency of fracturing to occur in the tool. This triggers a problem in that the tool life cannot be extended. With regard to such problem, the fracture resistance of the coated cutting tool disclosed in Patent Document 1 is required to be further improved.

The present invention has been made in order to solve the above problems, and an object of the present invention is to provide a coated cutting tool which has excellent fracture resistance and which accordingly allows for an extended tool life.

Solution to Problem

The present inventor has conducted studies regarding extending the tool life of a coated cutting tool and has accordingly found that the fracture resistance thereof can be enhanced by improving the layer configuration of a coating layer and the composition thereof, as well as by setting a predetermined range for a ratio between the elastic modulus of a specific layer structure and the hardness thereof, and found that, as a result, the tool life of the coated cutting tool can be extended, and this has led to the completion of the present invention.

Namely, the gist of the present invention is as set forth below.

(1) A coated cutting tool comprising a substrate and a coating layer formed on the substrate, wherein:
the coating layer has an alternating laminate structure of an alternating laminate of:
a first composite nitride layer containing a compound having a composition represented by formula (1) below:

$$(Al_{1-x}Cr_x)N \qquad (1)$$

(wherein x denotes an atomic ratio of the Cr element based on a total of the Al element and the Cr element and satisfies $0.10 \leq x \leq 0.50$); and
a second composite nitride layer containing a compound having a composition represented by formula (2) below:

$$(Ti_{1-y}Si_y)N \qquad (2)$$

(wherein y denotes an atomic ratio of the Si element based on a total of the Ti element and the Si element and satisfies $0.00 < y < 1.00$);
an average thickness of each of the layers of the first composite nitride layer is from 70 nm or more to 300 nm or less, and an average thickness of each of the layers of the second composite nitride layer is from 70 nm or more to 300 nm or less; and
a ratio H/E of a hardness H (unit: GPa) of the alternating laminate structure to an elastic modulus E (unit: GPa) of the alternating laminate structure is from 0.060 or more to 0.080 or less.

(2) The coated cutting tool according to (1), wherein, in formula (2), y satisfies $0.05 \leq y \leq 0.30$.

(3) The coated cutting tool according to (1) or (2), wherein the hardness H of the alternating laminate structure is from 33 GPa or higher to 40 GPa or lower.

(4) The coated cutting tool according to any of (1) to (3), wherein the elastic modulus E of the alternating laminate structure is from 500 GPa or higher to 550 GPa or lower.

(5) The coated cutting tool according to any of (1) to (4), wherein the second composite nitride layer comprises a cubic crystal system, and a ratio I(200)/I(111) of a peak intensity I(200) for a (200) plane of the second composite nitride layer to a peak intensity I(111) for a (111) plane of the second composite nitride layer in an X-ray diffraction analysis is from 1.0 or more to 20 or less.

(6) The coated cutting tool according to any of (1) to (5), wherein, in the second composite nitride layer, a full width at half maximum (FWHM) for a (200) plane in X-ray diffraction is from 0.4° or more to 1.0° or less.

(7) The coated cutting tool according to any of (1) to (6), wherein an average thickness of the alternating laminate structure is from 1.50 μm or more to 12.00 μm or less.

(8) The coated cutting tool according to any of (1) to (7), wherein:
the coating layer includes a lower layer between the substrate and the alternating laminate structure;
the lower layer is comprised of a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and
an average thickness of the lower layer is from 0.1 μm or more to 3.5 μm or less.

(9) The coated cutting tool according to any of (1) to (8), wherein:
the coating layer includes an upper layer on a surface of the alternating laminate structure;
the upper layer is comprised of a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and an average thickness of the upper layer is from 0.1 μm or more to 3.5 μm or less.

(10) The coated cutting tool according to any of (1) to (9), wherein an average thickness of the coating layer in its entirety is from 1.5 μm or no e to 15.0 μm or less.

(11) The coated cutting tool according to any of (1) to (10), wherein the substrate is a cemented carbide, cermet, ceramic or a cubic boron nitride sintered body.

Advantageous Effects of Invention

The present invention can provide a coated cutting tool which has excellent fracture resistance and which accordingly allows for an extended tool life.

BRIEF DESCRIPTION OF DRAWINGS

The FIGURE is a schematic view showing an example of a coated cutting tool according to the present invention.

DESCRIPTION OF EMBODIMENTS

An embodiment for carrying out the present invention (hereinafter simply referred to as the "present embodiment") will hereinafter be described in detail. However, the present invention is not limited to the present embodiment below. Various modifications may be made to the present invention without departing from the gist of the invention.

A coated cutting tool according to the present embodiment includes a substrate and a coating layer formed on a surface of the substrate. The substrate used in the present embodiment is not particularly limited, as long as it may be used as a substrate for the coated cutting tool. Examples of the substrate include a cemented carbide, cermet, ceramic, a cubic boron nitride sintered body, a diamond sintered body and high-speed steel. From among the above examples, the substrate is further preferably comprised of one or more kinds selected from the group consisting of a cemented carbide, cermet, ceramic and a cubic boron nitride sintered body because further excellent fracture resistance can be provided.

The coated cutting tool of the present embodiment shows the tendency of wear resistance to be further improved if the average thickness of the entire coating layer is 1.5 μm or more. Meanwhile, such coated cutting tool shows the tendency of fracture resistance to be further improved if the average thickness of the entire coating layer is 15.0 μm or less. Therefore, the average thickness of the entire coating layer is preferably from 1.5 μm or more to 15.0 μm or less. In particular, from the same perspective as that set forth above, the average thickness of the entire coating layer is more preferably from 2.0 μm or more to 10.0 μm or less, and is further preferably from 3.0 μm or more to 9.0 μm or less.

The coating layer used in the present embodiment includes an alternating laminate structure in which layers of two or three or more kinds, each kind having a different composition, are laminated in an alternating manner. At least one layer in the alternating laminate structure comprises a specific layer as described below (hereinafter referred to as a "first composite nitride layer"). The first composite nitride layer used in the present embodiment contains a compound having a composition represented by formula (1) below.

$$(Al_{1-x}Cr_x)N \tag{1}$$

The compound having the composition represented by formula (1) above in the first composite nitride layer used in the present embodiment preferably contains cubic crystals or contains cubic crystals and hexagonal crystals. In formula (1) above, x denotes an atomic ratio of the Cr element based on a total of the Al element and the Cr element and satisfies $0.10 \leq x \leq 0.50$. If the atomic ratio x of the Cr element is 0.10 or more, this can prevent a hexagonal Al nitride from being produced, thereby resulting in excellent wear resistance. Meanwhile, if the atomic ratio x of the Cr element is 0.50 or less, this can prevent a Cr nitride from being produced, thereby leading to excellent wear resistance, and can also prevent the residual stress of the first composite nitride layer from being reduced, thereby leading to excellent fracture resistance. In particular, x is preferably from 0.15 or more to 0.50 or less because a more excellent balance can be achieved between wear resistance and fracture resistance.

At least one layer in the alternating laminate structure of the coating layer used in the present embodiment comprises a specific layer as described below (hereinafter referred to as a "second composite nitride layer"). The second composite nitride layer used in the present embodiment contains a compound having a composition represented by formula (2) below.

$$(Ti_{1-y}Si_y)N \tag{2}$$

The compound having the composition represented by formula (2) above in the second composite nitride layer used in the present embodiment preferably contains cubic crystals. y denotes an atomic ratio of the Si element based on a total of the Ti element and the Si element, and y satisfies $0.00 < y < 1.00$, preferably satisfies $0.01 \leq y \leq 0.50$, and more preferably satisfies $0.05 \leq y \leq 0.30$. If the atomic ratio y of the Si element is more than 0.00, this indicates the tendency of hardness to be improved, and, in particular, if the atomic ratio y is 0.01 or more, and is preferably 0.05 or more, this results in a further improvement of hardness, thereby leading to further excellent wear resistance. Meanwhile, if the atomic ratio y of the Si element is less than 1.00, this can prevent an amorphous phase from being produced, thereby leading to excellent wear resistance, and can also suppress the residual compressive stress in the coating layer, thereby leading to excellent adhesion. From the same perspective, the atomic ratio y is preferably 0.50 or less, and is more preferably 0.30 or less. In particular, y is preferably from 0.10 or more to 0.25 or less because a more excellent balance can be achieved between wear resistance and adhesion.

In the present embodiment, when the composition of each composite nitride layer is represented by $(Al_{0.70}Cr_{0.30})N$, such representation indicates that the atomic ratio of the Al element based on a total of the Al element and the Cr element is 0.70 and that the atomic ratio of the Cr element based on a total of the Al element and the Cr element is 0.30. That is, such representation indicates that the amount of the Al element based on a total of the Al element and the Cr element is 70 atom % and that the amount of the Cr element based on a total of the Al element and the Cr element is 30 atom %.

In the coated cutting tool of the present embodiment, if the average thickness of each of the layers of each of the first composite nitride layer and the second composite nitride layer is 70 nm or more, this can prevent the internal stress of the coating layer from being increased, thereby leading to an improvement of fracture resistance. Meanwhile, if the average thickness of each of the layers of each of the first composite nitride layer and the second composite nitride layer is 300 nm or less, this can provide the effect of preventing cracking from progressing toward the substrate, thereby leading to an improvement of fracture resistance. From the same perspective, the average thickness of each of the layers of each of the first composite nitride layer and the second composite nitride layer is preferably from 100 nm or more to 300 nm or less, and is more preferably from 150 nm or more to 250 nm or less.

In the present embodiment, when one first composite nitride layer and one second composite nitride layer are formed, the "number of repeats" is one, and the alternating laminate structure used in the present embodiment encompasses an alternating laminate structure in which the number of repeats is one. The FIGURE is a schematic view showing an example of a cross-sectional structure of the coated cutting tool of the present embodiment, and this will be used below in order to describe the number of repeats. This coated cutting tool 8 includes a substrate 1 and a coating layer 7 formed on a surface of the substrate 1. The coating layer 7 is obtained by laminating a lower layer 2, which will be described below, an alternating laminate structure 6, and an upper layer 5, which will be described below, in order from the substrate 1 side. The alternating laminate structure 6 is obtained by laminating, in an alternating manner, a first composite nitride layer 3 and a second composite nitride layer 4, in order from the lower layer 2 side to the upper layer 5 side, and the resulting laminate includes four first composite nitride layers 3 and four second composite nitride layers 4. In such case, the number of repeats is four. Further, for example, when forming five first composite nitride layers 3 and five second composite nitride layers 4, i.e., a first composite nitride layer 3, a second composite nitride layer 4, a first composite nitride layer 3, a second composite nitride B layer 4, a first composite nitride layer 3, a second composite nitride layer 4, a first composite nitride layer 3, a second composite nitride layer 4, a first composite nitride A layer 3, and a second composite nitride layer 4, in order from the lower layer 2 side to the upper layer 5 side, the number of repeats is five. Although, in the FIGURE, the coating layer 7 includes both the lower layer 2 and the upper layer 5, the coating layer may instead include only either one of the lower layer 2 and the upper layer 5, or include neither of such two layers.

In the coated cutting tool of the present embodiment, if the average thickness of the alternating laminate structure is 1.50 μm or more, this leads to a further improvement of wear resistance, and if such average thickness is 12.00 μm or less, this leads to a further improvement of fracture resistance. Therefore, the average thickness of the alternating laminate structure is preferably from 1.50 μm or more to 12.00 μm or less, and is more preferably from 3.00 μm or more to 9.00 μm or less.

In the coated cutting tool of the present embodiment, in particular, a ratio [H/E] of a hardness H (unit: GPa) of the alternating laminate structure to an elastic modulus E (unit: GPa) thereof is set so as to be from 0.06 or more to 0.08 or less, and this leads to an improvement of fracture resistance, thereby resulting in a stable life of the coated cutting tool. The factors therefore can be considered to be set forth as follows. That is, the ratio [H/E] is 0.06 or more, and the ratio of the hardness is therefore 0.06 or more relative to the elastic modulus, and this serves as a main factor for cracking which is less likely to be generated even if a force is applied to the coated cutting tool; whereas, the ratio of the elastic modules is therefore 1/0.06 or less relative to the hardness, and this serves as a main factor for the progress of cracking which can be suppressed because, even if cracking is generated, a force applied to the alternating laminate structure can be relaxed. The generation of cracking and the progress thereof can be suppressed, as described above, and this leads to an improvement of fracture resistance. Meanwhile, if the ratio [H/E] is 0.08 or less, this suppresses plastic deformation of the coated cutting tool, and this mainly serves as a factor for the suppression of the generation of cracking, and such high hardness serves as a main factor for excellent wear resistance. Further, such suppression of the generation of cracking and such excellent wear resistance serve as main factors for an excellent balance between hardness and toughness, thereby leading to a stable life of the coated cutting tool, as well as to stable manufacturing of the coated cutting tool. However, the factors are not limited thereto. From the above perspectives, the ratio [H/E] is from 0.060 or more to 0.080 or less, is preferably from 0.063 or more to 0.078 or less, and is more preferably from 0.065 or more to 0.078 or less. It should be noted that, in this specification, the elastic modulus E and the hardness H of the alternating laminate structure are those at room temperature.

In the coated cutting tool of the present embodiment, if the hardness H of the alternating laminate structure is 33 GPa or higher, this leads to a further improvement of wear resistance, and, if the hardness H thereof is 40 GPa or lower, this leads to a further improvement of fracture resistance. Therefore, the hardness H of the alternating laminate structure is preferably from 33 GPa or higher to 40 GPa or lower, is more preferably from 34 GPa or higher to 39 GPa or lower, and is further preferably from 35 GPa or higher to 38 GPa or lower.

The hardness H of the alternating laminate structure can be measured by a nanoindentation method, using, for example, a dynamic hardness meter (e.g., product name "Nano Indenter" manufactured by MTS Systems Corporation).

In the coated cutting tool of the present embodiment, if the elastic modulus E of the alternating laminate structure is 500 GPa or higher, this leads to a further improvement of wear resistance, and, if the elastic modulus E thereof is 550 GPa or lower, this leads to a further improvement of fracture resistance. Therefore, the elastic modulus E of the alternating laminate structure is preferably from 500 GPa or higher to 550 GPa or lower, is more preferably from 520 GPa or higher to 545 GPa or lower, and is further preferably from 525 GPa or higher to 540 GPa or lower.

The elastic modulus E of the alternating laminate structure can be measured by a nanoindentation method, using, for example, a dynamic hardness meter (e.g., product name "Nano Indenter" manufactured by MTS Systems Corporation).

If an X-ray diffraction intensity ratio I(200)/I(111) of the second composite nitride layer is 1 or more, this can suppress the residual compressive stress of the coating layer, thereby leading to increased adhesion. Meanwhile, if the X-ray diffraction intensity ratio I(200)/I(111) of the second composite nitride layer is 20 or less, this leads to stable manufacturing of the coated cutting tool. Therefore, the X-ray diffraction intensity ratio I(200)/I(111) of the second composite nitride layer is preferably from 1 or more to 20 or less, is more preferably from 1.2 or more to 15 or less, and is further preferably from 1.3 or more to 13 or less.

In the present embodiment, I(200) refers to a peak intensity for a (200) plane in X-ray diffraction of the second composite nitride layer, and I(111) refers to a peak intensity for a (111) plane in X-ray diffraction of the second composite nitride layer.

The peak intensity for each crystal plane of the second composite nitride layer can be measured using a commercially available X-ray diffractometer. For instance, using model: RINT TTR III, being an X-ray diffractometer manufactured by Rigaku Corporation, an X-ray diffraction measurement by means of a 2θ/θ focusing optical system with Cu—Kα radiation is performed under the following conditions: an output: 50 kV, 250 mA; an incident-side solar slit: 5°; a divergence longitudinal slit: 2/3°; a divergence longitudinal limit slit: 5 mm; a scattering slit: 2/3°; a light-receiving side solar slit: 5°; a light-receiving slit: 0.3 mm; a BENT monochromater; a light-receiving monochrome slit: 0.8 mm; a sampling width: 0.01°; a scan speed: 4°/min; and a 2θ measurement range: 20°-140°, whereby the peak intensity for each crystal plane can be measured. When obtaining the peak intensity for each crystal plane from an X-ray diffraction pattern, analytic software included with the X-ray diffractometer may be used. With such analytic software, background processing and $K\alpha_2$ peak removal are conducted using cubic spline, and profile fitting is conducted using Pearson-VII function, whereby each peak intensity can be obtained. It should be noted that, when various layers are formed between the second composite nitride layer and the substrate, each peak intensity can be measured by a thin-film X-ray diffraction method in order to avoid the influence of the layer. Further, when various layers are formed on a side opposite to the substrate across the second composite nitride layer, an X-ray diffraction measurement may be performed after the removal of such various layers via buffing.

In the coated cutting tool of the present embodiment, if a full width at half maximum (FWHM) for a (200) plane in X-ray diffraction of the second composite nitride layer is 0.4° or more, this leads to a further improvement of fracture resistance. Meanwhile, if the FWHM for a (200) plane in X-ray diffraction of the second composite nitride layer is 1.0° or less, this leads to a further improvement of wear resistance. Therefore, the FWHM for a (200) plane is preferably from 0.4° or more to 1.0° or less, is more preferably from 0.6° or more to 1.0° or less, and is further preferably from 0.7° or more to 1.0° or less.

The FWHM for a (200) plane in X-ray diffraction of the second composite nitride layer can be measured under the measurement conditions set forth below.

Characteristic X-rays: Cu—Kα radiation; a monochromater: Ni; a divergence slit: 1/2°; a scattering slit: 2/3°; a light-receiving slit: 0.15 mm; and a sampling width: 0.01°.

The coating layer used in the present embodiment may be comprised of the alternating laminate structure alone consisting of the respective composite nitride layers. However, it is preferable for a lower layer to be provided between the substrate and the alternating laminate structure (i.e., located as a layer below the alternating laminate structure) because the adhesion between the substrate and the alternating laminate structure is further improved. In particular, the lower layer, from the same perspective as that set forth above, preferably contains a compound of: an element of at least one kind selected from the group consisting of Ti, Zr, Hf, V, Nb, Ta, Cr, Mo, W, Al, Si and Y; and an element of at least one kind selected from the group consisting of C, N, O and B, more preferably contains a compound of: an element of at least one kind selected from the group consisting of Ti, V, Nb, Ta, Cr, Mo, W, Al, Si and Y; and an element of at least one kind selected from the group consisting of C, N, O and B, and further preferably contains a compound of: an element of at least one kind selected from the group consisting of Ti, Ta, Cr, W, Al, Si and Y; and N.

Further, the lower layer may be comprised of a single layer or multiple layers of two or more layers.

In the present embodiment, the average thickness of the lower layer is preferably from 0.1 μm or more to 3.5 μm or less because this indicates the tendency of the adhesion between the substrate and the coating layer to be further improved. From the same perspective, the average thickness of the lower layer is more preferably from 0.2 μm or more to 3.0 μm or less, and is further preferably from 0.3 μm or more to 2.5 μm or less.

The coating layer used in the present embodiment may have an upper layer on a side of the alternating laminate structure which is opposite to the substrate (i.e., an upper layer on the alternating laminate structure), preferably on a surface of the alternating laminate structure. The upper layer further preferably contains a compound of: an element of at least one kind selected from the group consisting of Ti, Zr, Hf, V, Nb, Ta, Cr, Mo, W, Al, Si and Y; and an element of at least one kind selected from the group consisting of C, N, O and B because further excellent wear resistance is achieved. Further, from the same perspective as that set forth above, the upper layer preferably contains a compound of: an element of at least one kind selected from the group consisting of Ti, Zr, Hf, V, Nb, Ta, Cr, Mo, W, Al, Si and Y; and an element of at least one kind selected from the group consisting of C, N, O and B, more preferably contains a compound of: an element of at least one kind selected from the group consisting of Ti, V, Nb, Ta, Cr, Mo, W, Al, Si and Y; and an element of at least one kind selected from the group consisting of C, N, O and B, and further preferably contains a compound of: an element of at least one kind selected from the group consisting of Ti, Nb, Ta, Cr, W, Al, Si and Y; and N. Further, the upper layer may be comprised of a single layer or multiple layers of two or more layers.

In the present embodiment, the average thickness of the upper layer is preferably from 0.1 μm or more to 3.5 μm or less because this indicates the tendency of wear resistance to be excellent. From the same perspective, the average thickness of the upper layer is more preferably from 0.2 μm or more to 3.0 μm or less, and is further preferably from 0.3 μm or more to 2.5 μm or less.

A method of manufacturing a coating layer in a coated cutting tool according to the present embodiment is not particularly limited. However, examples of such method include physical vapor deposition methods, such as an ion plating method, an arc ion plating method, a sputtering method and an ion mixing method. The coating layer is preferably formed by a physical vapor deposition method because sharp edges can be formed. In particular, the arc ion plating method is more preferable because further excellent adhesion is achieved between the coating layer and the substrate.

A method of manufacturing a coated cutting tool according to the present embodiment will be described below, using specific examples. It should be noted that the method of manufacturing a coated cutting tool according to the present embodiment is not particularly limited, as long as the configurations of the coated cutting tool may be achieved.

Firstly, a substrate processed in a tool shape is received in a reactor of a physical vapor deposition apparatus, and metal evaporation sources are placed in the reactor. Thereafter, the reactor is evacuated until the pressure therein indicates a vacuum of $1.0 \times 10^{-2}$ Pa or lower, and the substrate is heated, by a heater in the reactor, until the temperature reaches from 200° C. or higher to 700° C. or lower. After the heating, an Ar gas is introduced into the reactor so that the pressure therein is from 0.5 Pa or higher to 5.0 Pa or lower. In the Ar gas atmosphere with a pressure of from 0.5 Pa or higher to 5.0 Pa or lower, a bias voltage of from −500 V or higher to −350 V or lower is applied to the substrate, and a current of from 40 A or higher to 50 A or lower is caused to flow through a tungsten filament in the reactor, whereby an ion bombardment process is carried out, with the Ar gas, on a surface of the substrate. After the ion bombardment process is carried out on the substrate surface, the reactor is evacuated until the pressure therein indicates a vacuum of $1.0 \times 10^{-2}$ Pa or lower.

When forming the lower layer used in the present embodiment, the substrate is heated until the temperature is from 400° C. or higher to 600° C. or lower. After the heating, a gas is introduced into the reactor such that the pressure therein is from 0.5 Pa or higher to 5.0 Pa or lower. Examples of such gas include an $N_2$ gas when the lower layer comprises a compound of: an element of at least one kind selected from the group consisting of Ti, Zr, Hf, V, Nb, Ta, Cr, Mo, W, Al, Si and Y; and N, and further examples of such gas also include a gas mixture of an $N_2$ gas and a $C_2H_2$ gas when the lower layer comprises a compound of: an element of at least one kind selected from the group consisting of Ti, Zr, Hf, V, Nb, Ta, Cr, Mo, W, Al, Si and Y; and N and C. The volume ratio of the gas mixture is not particularly limited; however, such volume ratio may be $N_2$ gas:$C_2H_2$ gas=95:5 to 85:15, by way of example. Then, a bias voltage of from −80 V or higher to −40 V or lower is applied to the substrate, and a metal evaporation source according to the metal components of each layer is evaporated via an arc discharge with an arc current of from 100 A or higher to 200 A or lower, whereby the lower layer may be formed.

When forming the first composite nitride layer used in the present embodiment, the substrate is controlled such that the temperature is from 400° C. or higher to 600° C. or lower, a nitrogen gas ($N_2$) is introduced in the reactor, and the pressure in the reactor is set at from 0.5 Pa or higher to 5.0 Pa or lower. Thereafter, a bias voltage of from −80 V or higher to −40 V or lower is applied to the substrate, and a metal evaporation source according to the metal components of the first composite nitride layer is evaporated via an arc discharge with an arc current of from 100 A or higher to 200 A or lower, whereby the first composite nitride layer may be formed.

When forming the second composite nitride layer used in the present embodiment, the substrate is controlled such that the temperature is from 400° C. or higher to 600° C. or lower. It should be noted that the substrate temperature is preferably the same as the substrate temperature when the first composite nitride layer is formed because the first composite nitride layer and the second composite nitride layer can be formed in a continuous manner. After the temperature control, an $N_2$ gas is introduced into the reactor so that the pressure therein is from 0.5 Pa or higher to 5.0 Pa or lower. Then, a bias voltage of from −80 V or higher to −40 V or lower is applied to the substrate, and a metal evaporation source according to the metal components of the second composite nitride layer is evaporated via an arc discharge with an arc current of from 100 A or higher to 200 A or lower, whereby the second composite nitride layer may be formed.

In order to form the alternating laminate structure of the first composite nitride layer and the second composite nitride layer, two or more kinds of metal evaporation sources are evaporated in an alternating manner via an arc discharge under the conditions set forth above, whereby the respective composite nitride layers may be formed in an alternating manner. By adjusting the arc discharge time for each of the metal evaporation sources, the thickness of each composite nitride layer which constitutes the alternating laminate structure can be controlled.

In order to set a predetermined value for the ratio [H/E] of the hardness H to the elastic modulus E in the alternating laminate structure used in the present embodiment, when forming the alternating laminate structure, the bias voltage may be adjusted, the lamination interval may be adjusted, or the Cr ratio of the compound represented by formula (1) which is contained in the first composite nitride layer may be adjusted. More specifically, the application of a higher negative bias voltage leads to a higher hardness H of the alternating laminate structure. Meanwhile, an increased thickness (also referred to as a "lamination interval") of each composite nitride layer or a reduced Cr ratio of the compound represented by formula (1) leads to a lower elastic modulus E of the alternating laminate structure.

In order to set a predetermined value for the X-ray diffraction intensity ratio I(200)/I(111) in the second composite nitride layer used in the present embodiment, the thickness of the second composite nitride layer may be controlled, the Al ratio of the compound represented by formula (1) which is contained in the first composite nitride layer may be adjusted, or the Si ratio of the compound represented by formula (2) which is contained in the second composite nitride layer may be adjusted. More specifically, a decreased thickness of the second composite nitride layer, or a reduced Al ratio of the compound represented by formula (1) or a reduced Si ratio of the compound represented by formula (2) leads to a smaller I(200).

In order to set a predetermined value for the FWHM for a (200) plane in X-ray diffraction in the second composite nitride layer used in the present embodiment, when forming the alternating laminate structure, the deposition temperature may be adjusted, the bias voltage may be adjusted, or the lamination interval may be adjusted. More specifically, the setting of a lower deposition temperature, the application of a higher negative bias voltage, or the increasing of a lamination interval, leads to a greater value for the FWHM for a (200) plane.

When forming the upper layer used in the present embodiment, such upper layer may be formed under the same manufacturing conditions as those described above for the lower layer. That is, first, the substrate is heated until the temperature is from 400° C. or higher to 600° C. or lower. After the heating, a gas is introduced into the reactor such that the pressure therein is from 0.5 Pa or higher to 5.0 Pa or lower. Examples of such gas include an $N_2$ gas when the upper layer comprises a compound of: an element of at least one kind selected from the group consisting of Ti, Zr, Hf, V, Nb, Ta, Cr, Mo, W, Al, Si and Y; and N, and further examples of such gas also include a gas mixture of an $N_2$ gas and a $C_2H_2$ gas when the upper layer comprises a compound of: an element of at least one kind selected from the group consisting of Ti, Zr, Hf, V, Nb, Ta, Cr, Mo, W, Al, Si and Y; and N and C. The volume ratio of the gas mixture is not particularly limited; however, such volume ratio may be $N_2$ gas:$C_2H_2$ gas=95:5 to 85:15, by way of example. Then, a bias voltage of from −80 V or higher to −40 V or lower is applied to the substrate, and a metal evaporation source according to the metal components of each layer is evaporated via an arc discharge with an arc current of from 100 A or higher to 200 A or lower, whereby the upper layer may be formed.

The thickness of each layer which constitutes the coating layer in the coated cutting tool of the present embodiment can be measured from a cross-sectional structure of the coated cutting tool, using an optical microscope, a scanning electron microscope (SEM), a transmission electron microscope (TEM), or the like. It should be noted that, as to the average thickness of each layer in the coated cutting tool of the present embodiment, such average thickness can be obtained by: measuring the thickness of each layer, from each of the cross-sectional surfaces at three or more locations near the position 50 μm from the edge of a surface facing the metal evaporation source, toward the center of such surface; and calculating the average value (arithmetic mean) of the resulting measurements.

The composition of each layer which constitutes the coating layer in the coated cutting tool of the present embodiment can be measured from a cross-sectional structure of the coated cutting tool of the present embodiment, using an energy-dispersive X-ray spectroscope (EDS), a wavelength-dispersive X-ray spectroscope (WDS), or the like.

The coated cutting tool of the present embodiment can be considered to provide the effect of being capable of extending the tool life compared with the prior art due to the major point of having excellent fracture resistance (it should be noted, however, that the factor of such extension of tool life is not limited thereto). Specific examples of types of the coated cutting tool of the present embodiment include an indexable cutting insert for milling or turning, a drill, an end mill, etc.

EXAMPLES

Although the present invention will be described in further detail below, with examples, the present invention is not limited to such examples.

Example 1

A machined cemented carbide insert with a shape of DMP120 (manufactured by Tungaloy Corporation) and a composition of 89.6% WC-9.8% Co-0.6% $Cr_3C_2$ (mass %) was prepared as a substrate. In a reactor of an arc ion plating apparatus, a metal evaporation source was arranged so as to achieve the composition of each layer shown in each of Tables 1 and 2. The prepared substrate was fixed to a fixation fitting of a rotating table in the reactor.

Thereafter, the reactor was evacuated until the pressure therein indicated a vacuum of $5.0 \times 10^{-3}$ Pa or lower. After the evacuation, the substrate was heated, by a heater in the reactor, until the temperature reached 450° C. After the heating, an Ar gas was introduced into the reactor such that the pressure therein was 2.7 Pa.

In the Ar gas atmosphere with a pressure of 2.7 Pa, a bias voltage of −400 V was applied to the substrate, and a current of 40 A was caused to flow through a tungsten filament in the reactor, whereby an ion bombardment process was carried out, with the Ar gas, on a surface of the substrate for 30 minutes. After the ion bombardment process, the reactor was evacuated until the pressure therein indicated a vacuum of $5.0 \times 10^{-3}$ Pa or lower.

As to invention samples 1 to 30, after the evacuation, the substrate was controlled such that the temperature reached the temperature shown in Table 3 (temperature when the deposition was started), a nitrogen gas ($N_2$) was introduced into the reactor, and an adjustment was conducted to achieve the gas condition of the pressure shown in Table 3 in the reactor. Thereafter, as to invention samples 1 to 30, the bias voltage shown in Table 3 was applied to the substrate, and the metal evaporation sources for the first composite nitride layer and the second composite nitride layer respectively having the compositions shown in Table 1 were evaporated in an alternating manner via an arc discharge with the arc current shown in Table 3, whereby the first composite nitride layer and the second composite nitride layer were formed on the substrate surface in an alternating manner. At this time, control was carried out so as to achieve the gas conditions and pressure, which are shown in Table 3, in the reactor. Further, with regard to each of the thicknesses of the first composite nitride layer and the second composite nitride layer, the arc discharge time was adjusted for control so as to achieve the thickness shown in Table 1.

As to comparative samples 1 and 2, after the evacuation, the substrate was controlled such that the temperature reached the temperature shown in Table 4 (temperature when the deposition was started), a gas with the composition shown in Table 4 was introduced into the reactor, and an adjustment was conducted to achieve the gas condition of the pressure shown in Table 4 in the reactor. Thereafter, the bias voltage shown in Table 4 was applied to the substrate, and the metal evaporation source involving the composition shown in Table 2 was evaporated via an arc discharge with the arc current shown in Table 4, whereby a single layer (A layer or B layer) having the thickness shown in Table 2 was formed on the surface of the substrate.

As to comparative samples 3 to 11, after the evacuation, the substrate was controlled such that the temperature reached the temperature shown in Table 4 (temperature when the deposition was started), a gas with the composition shown in Table 4 was introduced into the reactor, and an adjustment was conducted to achieve the gas condition of the pressure shown in Table 4 in the reactor. Thereafter, the bias voltage shown in Table 4 was applied to the substrate, and the metal evaporation sources for the A layer and the B layer respectively having the compositions shown in Table 2 were evaporated in an alternating manner via an arc discharge with the arc current shown in Table 4, whereby the A layer and the B layer were formed on the substrate surface in an alternating manner. At this time, control was carried out so as to achieve the gas conditions and pressure, which are shown in Table 4, in the reactor. Further, with regard to each of the thicknesses of the A layer and the B layer, the arc discharge time was adjusted for control so as to achieve the thickness shown in Table 2.

After the formation of each layer with the predetermined average thickness shown in each of Tables 1 and 2 on the substrate surface, the heater was turned off, and the sample was taken out of the reactor after the temperature of the sample reached 100° C. or lower.

TABLE 1

| | Coating layer | | | | | |
|---|---|---|---|---|---|---|
| | Alternating laminate structure | | | | | |
| | First composite nitride layer | | Second composite nitride layer | | | | Average |
| Sample No. | Composition | Average thickness of each of layers (nm) | Composition | Average thickness of each of layers (nm) | Number of repeats (times) | Average thickness (μm) | thickness of entire coating layer (μm) |
|---|---|---|---|---|---|---|---|
| Invention sample 1 | $(Al_{0.70}Cr_{0.30})N$ | 150 | $(Ti_{0.80}Si_{0.20})N$ | 150 | 10 | 3.00 | 3.00 |
| Invention sample 2 | $(Al_{0.70}Cr_{0.30})N$ | 150 | $(Ti_{0.80}Si_{0.20})N$ | 150 | 10 | 3.00 | 3.00 |
| Invention sample 3 | $(Al_{0.70}Cr_{0.30})N$ | 150 | $(Ti_{0.80}Si_{0.20})N$ | 150 | 10 | 3.00 | 3.00 |
| Invention sample 4 | $(Al_{0.70}Cr_{0.30})N$ | 100 | $(Ti_{0.80}Si_{0.20})N$ | 100 | 15 | 3.00 | 3.00 |
| Invention sample 5 | $(Al_{0.70}Cr_{0.30})N$ | 70 | $(Ti_{0.80}Si_{0.20})N$ | 70 | 22 | 3.08 | 3.08 |
| Invention sample 6 | $(Al_{0.70}Cr_{0.30})N$ | 250 | $(Ti_{0.80}Si_{0.20})N$ | 250 | 6 | 3.00 | 3.00 |
| Invention sample 7 | $(Al_{0.85}Cr_{0.15})N$ | 150 | $(Ti_{0.80}Si_{0.20})N$ | 150 | 10 | 3.00 | 3.00 |
| Invention sample 8 | $(Al_{0.85}Cr_{0.15})N$ | 150 | $(Ti_{0.80}Si_{0.20})N$ | 150 | 10 | 3.00 | 3.00 |
| Invention sample 9 | $(Al_{0.85}Cr_{0.15})N$ | 150 | $(Ti_{0.80}Si_{0.20})N$ | 150 | 10 | 3.00 | 3.00 |
| Invention sample 10 | $(Al_{0.85}Cr_{0.15})N$ | 100 | $(Ti_{0.80}Si_{0.20})N$ | 100 | 15 | 3.00 | 3.00 |
| Invention sample 11 | $(Al_{0.85}Cr_{0.15})N$ | 300 | $(Ti_{0.80}Si_{0.20})N$ | 300 | 5 | 3.00 | 3.00 |
| Invention sample 12 | $(Al_{0.70}Cr_{0.30})N$ | 150 | $(Ti_{0.90}Si_{0.10})N$ | 150 | 10 | 3.00 | 3.00 |
| Invention sample 13 | $(Al_{0.70}Cr_{0.30})N$ | 150 | $(Ti_{0.90}Si_{0.10})N$ | 150 | 10 | 3.00 | 3.00 |
| Invention sample 14 | $(Al_{0.70}Cr_{0.30})N$ | 150 | $(Ti_{0.90}Si_{0.10})N$ | 150 | 10 | 3.00 | 3.00 |
| Invention sample 15 | $(Al_{0.50}Cr_{0.50})N$ | 150 | $(Ti_{0.80}Si_{0.20})N$ | 150 | 10 | 3.00 | 3.00 |
| Invention sample 16 | $(Al_{0.50}Cr_{0.50})N$ | 150 | $(Ti_{0.80}Si_{0.20})N$ | 150 | 10 | 3.00 | 3.00 |
| Invention sample 17 | $(Al_{0.50}Cr_{0.50})N$ | 150 | $(Ti_{0.80}Si_{0.20})N$ | 150 | 10 | 3.00 | 3.00 |
| Invention sample 18 | $(Al_{0.70}Cr_{0.30})N$ | 150 | $(Ti_{0.70}Si_{0.30})N$ | 150 | 10 | 3.00 | 3.00 |
| Invention sample 19 | $(Al_{0.70}Cr_{0.30})N$ | 150 | $(Ti_{0.70}Si_{0.30})N$ | 150 | 10 | 3.00 | 3.00 |
| Invention sample 20 | $(Al_{0.70}Cr_{0.30})N$ | 150 | $(Ti_{0.70}Si_{0.30})N$ | 150 | 10 | 3.00 | 3.00 |
| Invention sample 21 | $(Al_{0.70}Cr_{0.30})N$ | 150 | $(Ti_{0.80}Si_{0.20})N$ | 150 | 30 | 9.00 | 9.00 |
| Invention sample 22 | $(Al_{0.70}Cr_{0.30})N$ | 100 | $(Ti_{0.80}Si_{0.20})N$ | 100 | 30 | 6.00 | 6.00 |
| Invention sample 23 | $(Al_{0.70}Cr_{0.30})N$ | 200 | $(Ti_{0.80}Si_{0.20})N$ | 200 | 5 | 2.00 | 2.00 |
| Invention sample 24 | $(Al_{0.85}Cr_{0.15})N$ | 150 | $(Ti_{0.90}Si_{0.10})N$ | 150 | 10 | 3.00 | 3.00 |
| Invention sample 25 | $(Al_{0.50}Cr_{0.50})N$ | 150 | $(Ti_{0.90}Si_{0.10})N$ | 150 | 10 | 3.00 | 3.00 |
| Invention sample 26 | $(Al_{0.85}Cr_{0.15})N$ | 200 | $(Ti_{0.90}Si_{0.10})N$ | 200 | 15 | 6.00 | 6.00 |
| Invention sample 27 | $(Al_{0.50}Cr_{0.50})N$ | 200 | $(Ti_{0.90}Si_{0.10})N$ | 200 | 15 | 6.00 | 6.00 |
| Invention sample 28 | $(Al_{0.70}Cr_{0.30})N$ | 150 | $(Ti_{0.95}Si_{0.05})N$ | 150 | 10 | 3.00 | 3.00 |
| Invention sample 29 | $(Al_{0.70}Cr_{0.30})N$ | 150 | $(Ti_{0.95}Si_{0.05})N$ | 150 | 10 | 3.00 | 3.00 |
| Invention sample 30 | $(Al_{0.70}Cr_{0.30})N$ | 150 | $(Ti_{0.95}Si_{0.05})N$ | 150 | 10 | 3.00 | 3.00 |

TABLE 2

| | Coating layer | | | | | Average thickness of entire coating layer (μm) |
|---|---|---|---|---|---|---|
| | Alternating laminate structure | | | | | |
| | A layer | | B layer | | | |
| Sample No. | Composition | Average thickness of each of layers (nm) | Composition | Average thickness of each of layers (nm) | Number of repeats (times) | Average thickness (μm) |
| Comparative sample 1 | $(Al_{0.70}Cr_{0.30})N$ | 3,000 | — | — | 1 | 3.00 | 3.00 |
| Comparative sample 2 | — | — | $(Ti_{0.80}Si_{0.20})N$ | 3,000 | 1 | 3.00 | 3.00 |
| Comparative sample 3 | $(Al_{0.70}Cr_{0.30})N$ | 150 | $(Ti_{0.80}Si_{0.20})N$ | 150 | 10 | 3.00 | 3.00 |
| Comparative sample 4 | $(Al_{0.70}Cr_{0.30})N$ | 30 | $(Ti_{0.80}Si_{0.20})N$ | 30 | 50 | 3.00 | 3.00 |
| Comparative sample 5 | AlN | 150 | $(Ti_{0.80}Si_{0.20})N$ | 150 | 10 | 3.00 | 3.00 |
| Comparative sample 6 | $(Al_{0.70}Cr_{0.30})N$ | 150 | TiN | 150 | 10 | 3.00 | 3.00 |
| Comparative sample 7 | $(Al_{0.70}Cr_{0.30})N$ | 150 | $(Ti_{0.60}Si_{0.40})N$ | 150 | 10 | 3.00 | 3.00 |
| Comparative sample 8 | $(Al_{0.70}Cr_{0.30})N$ | 500 | $(Ti_{0.80}Si_{0.20})N$ | 500 | 3 | 3.00 | 3.00 |
| Comparative sample 9 | $(Al_{0.85}Cr_{0.15})N$ | 300 | $(Ti_{0.80}Si_{0.20})N$ | 300 | 5 | 3.00 | 3.00 |
| Comparative sample 10 | $(Ti_{0.50}Al_{0.50})N$ | 150 | $(Ti_{0.80}Si_{0.20})N$ | 150 | 10 | 3.00 | 3.00 |
| Comparative sample 11 | $(Al_{0.70}Cr_{0.30})N$ | 150 | $(Ti_{0.50}Al_{0.50})N$ | 150 | 10 | 3.00 | 3.00 |

TABLE 3

| | | | Gas conditions | | | |
|---|---|---|---|---|---|---|
| Sample No. | Deposition temperature (° C.) | Pressure (Pa) | First composite nitride layer $N_2$ (vol %) | Second composite nitride layer $N_2$ (vol %) | Bias voltage (V) | Arc current (A) |
| Invention sample 1 | 500 | 3.0 | 100 | 100 | −60 | 200 |
| Invention sample 2 | 500 | 3.0 | 100 | 100 | −40 | 200 |
| Invention sample 3 | 500 | 3.0 | 100 | 100 | −80 | 200 |
| Invention sample 4 | 500 | 3.0 | 100 | 100 | −60 | 180 |
| Invention sample 5 | 500 | 3.0 | 100 | 100 | −60 | 180 |
| Invention sample 6 | 500 | 3.0 | 100 | 100 | −60 | 180 |
| Invention sample 7 | 500 | 3.0 | 100 | 100 | −60 | 200 |
| Invention sample 8 | 500 | 3.0 | 100 | 100 | −40 | 200 |
| Invention sample 9 | 500 | 3.0 | 100 | 100 | −80 | 200 |
| Invention sample 10 | 500 | 3.0 | 100 | 100 | −60 | 150 |
| Invention sample 11 | 500 | 3.0 | 100 | 100 | −60 | 150 |
| Invention sample 12 | 400 | 3.0 | 100 | 100 | −60 | 150 |
| Invention sample 13 | 400 | 3.0 | 100 | 100 | −40 | 200 |
| Invention sample 14 | 400 | 3.0 | 100 | 100 | −80 | 200 |
| Invention sample 15 | 500 | 3.0 | 100 | 100 | −60 | 200 |
| Invention sample 16 | 500 | 3.0 | 100 | 100 | −40 | 200 |

TABLE 3-continued

| Sample No. | Deposition temperature (° C.) | Pressure (Pa) | Gas conditions First composite nitride layer $N_2$ (vol %) | Gas conditions Second composite nitride layer $N_2$ (vol %) | Bias voltage (V) | Arc current (A) |
|---|---|---|---|---|---|---|
| Invention sample 17 | 500 | 3.0 | 100 | 100 | −80 | 200 |
| Invention sample 18 | 500 | 3.0 | 100 | 100 | −60 | 200 |
| Invention sample 19 | 500 | 3.0 | 100 | 100 | −40 | 200 |
| Invention sample 20 | 500 | 3.0 | 100 | 100 | −80 | 200 |
| Invention sample 21 | 500 | 3.0 | 100 | 100 | −40 | 180 |
| Invention sample 22 | 500 | 3.0 | 100 | 100 | −40 | 200 |
| Invention sample 23 | 500 | 3.0 | 100 | 100 | −80 | 200 |
| Invention sample 24 | 500 | 3.0 | 100 | 100 | −40 | 200 |
| Invention sample 25 | 500 | 3.0 | 100 | 100 | −60 | 200 |
| Invention sample 26 | 500 | 3.0 | 100 | 100 | −40 | 200 |
| Invention sample 27 | 500 | 3.0 | 100 | 100 | −60 | 200 |
| Invention sample 28 | 400 | 3.0 | 100 | 100 | −60 | 150 |
| Invention sample 29 | 400 | 3.0 | 100 | 100 | −40 | 200 |
| Invention sample 30 | 400 | 3.0 | 100 | 100 | −80 | 200 |

TABLE 4

| Sample No. | Deposition temperature (° C.) | Pressure (Pa) | Gas conditions A layer $N_2$ (vol %) | Gas conditions B layer $N_2$ (vol %) | Bias voltage (V) | Arc current (A) |
|---|---|---|---|---|---|---|
| Comparative sample 1 | 500 | 3.0 | 100 | — | −60 | 200 |
| Comparative sample 2 | 500 | 3.0 | — | 100 | −60 | 200 |
| Comparative sample 3 | 500 | 3.0 | 100 | 100 | −30 | 200 |
| Comparative sample 4 | 500 | 3.0 | 100 | 100 | −60 | 200 |
| Comparative sample 5 | 500 | 3.0 | 100 | 100 | −60 | 200 |
| Comparative sample 6 | 500 | 3.0 | 100 | 100 | −60 | 200 |
| Comparative sample 7 | 500 | 3.0 | 100 | 100 | −60 | 200 |
| Comparative sample 8 | 500 | 3.0 | 100 | 100 | −60 | 200 |
| Comparative sample 9 | 500 | 3.0 | 100 | 100 | −90 | 150 |
| Comparative sample 10 | 500 | 3.0 | 100 | 100 | −60 | 200 |
| Comparative sample 11 | 500 | 3.0 | 100 | 100 | −60 | 200 |

* Each "—" symbol in the "$N_2$" column for either "A layer" or "B layer" indicates that either an A layer or a B layer, respectively, is not formed.

As to the average thickness of each layer of each of the obtained samples, such average thickness was obtained by: measuring the thickness of each layer via a TEM observation of each of the cross-sectional surfaces at three locations near the position 50 μm from the edge of a surface facing the metal evaporation source of the coated cutting tool, toward the center of such surface; and calculating the average value (arithmetic mean) of the resulting measurements. The results are shown in Tables 1 and 2.

The composition of each layer of the obtained sample was measured from the cross-sectional surface near the position at most 50 μm from the edge of a surface facing the metal evaporation source of the coated cutting tool, toward the center of such surface, using an EDS attached to a TEM. The measurement results are shown in Tables 1 and 2. It should be noted that the composition ratio of the metal elements of each layer in each of Tables 1 and 2 refers to an atomic ratio of each metal element relative to all the metal elements in the metal compound which constitutes each layer.

The hardness H of the obtained sample was measured using a dynamic hardness tester (for example, product name "Nano Indenter" manufactured by MTS Systems Corporation). The elastic modulus E of the obtained sample was also measured using the dynamic hardness tester (for example, product name "Nano Indenter" manufactured by MTS Systems Corporation. The I(200)/I(111) of the obtained sample was calculated by measuring an I(200) and an I(111) via an X-ray diffraction measurement, using model: RINT TTR III, being an X-ray diffractometer manufactured by Rigaku Corporation, by means of a 2θ/θ focusing optical system with Cu—Kα radiation under the following conditions: an output: 50 kV, 250 mA; an incident-side solar slit: 5°; a divergence longitudinal slit: 2/3°; a divergence longitudinal limit slit: 5 mm; a scattering slit: 2/3°; a light-receiving side solar slit: 5°; a light-receiving slit: 0.3 mm; a BENT monochromater; a light-receiving monochrome slit: 0.8 mm; a sampling width: 0.01°; a scan speed: 4°/min; and a measurement range: 20-140°. The FWHM for a (200 plane of the obtained sample was measured under the measurement conditions set forth below.

Characteristic X-rays: Cu—Kα radiation; a monochromater: Ni; a divergence slit: 1/2°; a scattering slit: 2/3°; a light-receiving slit: 0.15 mm; and a sampling width: 0.01°.

The results are shown in Tables 5 and 6. As to each of the comparison samples, the hardness H of the A layer and the B layer, the elastic modulus E thereof, the I(200)/I(111) and the FWHM for a (200) plane were measured.

TABLE 5

| Sample No. | Alternating laminate structure | | | Second composite nitride layer I(200)/I(111) | Second composite nitride layer FWHM(°) for a (200) plane |
|---|---|---|---|---|---|
| | Hardness H (GPa) | Elastic modulus E (GPa) | H/E | | |
| Invention sample 1 | 37 | 525 | 0.070 | 4.8 | 0.7 |
| Invention sample 2 | 34 | 525 | 0.065 | 4.8 | 0.6 |
| Invention sample 3 | 40 | 525 | 0.076 | 4.8 | 0.8 |
| Invention sample 4 | 36 | 545 | 0.066 | 3.2 | 0.8 |
| Invention sample 5 | 37 | 570 | 0.065 | 2.0 | 1.0 |
| Invention sample 6 | 36 | 500 | 0.072 | 6.6 | 0.6 |
| Invention sample 7 | 36 | 500 | 0.072 | 2.5 | 0.9 |
| Invention sample 8 | 34 | 500 | 0.068 | 2.0 | 0.8 |
| Invention sample 9 | 39 | 500 | 0.078 | 4.0 | 1.0 |
| Invention sample 10 | 36 | 530 | 0.068 | 2.0 | 1.0 |
| Invention sample 11 | 37 | 490 | 0.076 | 6.8 | 0.8 |
| Invention sample 12 | 34 | 525 | 0.065 | 2.5 | 0.9 |
| Invention sample 13 | 32 | 525 | 0.061 | 2.5 | 0.8 |
| Invention sample 14 | 38 | 525 | 0.072 | 2.5 | 1.0 |
| Invention sample 15 | 37 | 540 | 0.069 | 3.3 | 0.7 |
| Invention sample 16 | 34 | 540 | 0.063 | 3.3 | 0.6 |
| Invention sample 17 | 40 | 540 | 0.074 | 3.3 | 0.8 |
| Invention sample 18 | 38 | 525 | 0.072 | 12.6 | 0.8 |
| Invention sample 19 | 35 | 525 | 0.067 | 12.6 | 0.7 |
| Invention sample 20 | 40 | 525 | 0.076 | 12.6 | 1.0 |
| Invention sample 21 | 34 | 525 | 0.065 | 4.8 | 0.7 |
| Invention sample 22 | 33 | 545 | 0.061 | 3.2 | 1.1 |
| Invention sample 23 | 40 | 525 | 0.076 | 4.8 | 0.6 |
| Invention sample 24 | 34 | 500 | 0.068 | 1.5 | 0.6 |
| Invention sample 25 | 33 | 540 | 0.061 | 1.3 | 0.7 |
| Invention sample 26 | 34 | 480 | 0.071 | 2.1 | 0.8 |
| Invention sample 27 | 33 | 520 | 0.063 | 2.4 | 0.8 |
| Invention sample 28 | 33 | 525 | 0.063 | 1.8 | 0.9 |
| Invention sample 29 | 32 | 525 | 0.061 | 1.8 | 0.8 |
| Invention sample 30 | 36 | 525 | 0.069 | 1.8 | 1.0 |

TABLE 6

| Sample No. | Alternating laminate structure | | | Second composite nitride layer I(200)/I(111) | Second composite nitride layer FWHM(°) for a (200) plane |
|---|---|---|---|---|---|
| | Hardness H (GPa) | Elastic modulus E (GPa) | H/E | | |
| Comparative sample 1 | 32 | 530 | 0.060 | — | — |
| Comparative sample 2 | 37 | 515 | 0.072 | 23.0 | 0.5 |
| Comparative sample 3 | 31 | 525 | 0.059 | 4.8 | 0.4 |
| Comparative sample 4 | 41 | 590 | 0.069 | 22.0 | 1.2 |
| Comparative sample 5 | 34 | 500 | 0.068 | 5.0 | 0.7 |
| Comparative sample 6 | 30 | 525 | 0.057 | — | — |
| Comparative sample 7 | 30 | 525 | 0.057 | 21.0 | 0.7 |
| Comparative sample 8 | 36 | 490 | 0.073 | 11.0 | 0.9 |
| Comparative sample 9 | 40 | 490 | 0.082 | 10.2 | 1.0 |

TABLE 6-continued

| Sample No. | Alternating laminate structure | | | Second composite nitride layer I(200)/I(111) | Second composite nitride layer FWHM(°) for a (200) plane |
|---|---|---|---|---|---|
| | Hardness H (GPa) | Elastic modulus E (GPa) | H/E | | |
| Comparative sample 10 | 35 | 560 | 0.063 | 8.0 | 0.7 |
| Comparative sample 11 | 29 | 570 | 0.051 | — | — |

Using the obtained samples, the following cutting test was conducted in order to perform evaluations.

[Cutting Test]
Workpiece: S55C (200HB)
Workpiece shape: Parallelepiped block of 150 mm×200 mm×40 mm
Machining form: Blind holes
Cutting speed: 100 m/min
Feed per revolution: 0.25 mm/rev
Coolant: Water-soluble coolant (internal oil supply system)
Evaluation items: A time when a chisel edge was fractured (chipping occurred in a chisel edge), when a feed mark occurred in a margin portion or when a flank wear had a width of 0.3 mm was defined as the end of the tool life, and the machining length to reach the end of the tool life was measured.

As to the machining length to reach the end of the tool life in the test on fracture resistance, evaluations were made with grade "A" for 100 m or more, grade "B" for 70 m or more and less than 100 m, and grade "C" for less than 70 m. In such evaluations, "A" refers to excellent, "B" refers to good and "C" refers to inferior, meaning that a sample involving a larger number of grade "A"s or "B"s has more excellent cutting performance. More specifically, a long machining length indicates excellent fracture resistance and wear resistance. The evaluation results are shown in Table 7.

TABLE 7

| | Cutting test | |
|---|---|---|
| Sample No. | Machining length (m) | Grade |
| Invention sample 1 | 148 | A |
| Invention sample 2 | 130 | A |
| Invention sample 3 | 166 | A |
| Invention sample 4 | 109 | A |
| Invention sample 5 | 80 | B |
| Invention sample 6 | 164 | A |
| Invention sample 7 | 141 | A |
| Invention sample 8 | 123 | A |
| Invention sample 9 | 157 | A |
| Invention sample 10 | 99 | B |
| Invention sample 11 | 86 | B |
| Invention sample 12 | 126 | A |
| Invention sample 13 | 95 | B |
| Invention sample 14 | 150 | A |
| Invention sample 15 | 145 | A |
| Invention sample 16 | 124 | A |
| Invention sample 17 | 166 | A |
| Invention sample 18 | 139 | A |
| Invention sample 19 | 118 | A |
| Invention sample 20 | 160 | A |
| Invention sample 21 | 203 | A |
| Invention sample 22 | 92 | B |
| Invention sample 23 | 102 | A |
| Invention sample 24 | 90 | B |
| Invention sample 25 | 78 | B |
| Invention sample 26 | 73 | B |
| Invention sample 27 | 126 | A |
| Invention sample 28 | 113 | A |
| Invention sample 29 | 91 | B |
| Invention sample 30 | 130 | A |
| Comparative sample 1 | 12 | C |
| Comparative sample 2 | 10 | C |
| Comparative sample 3 | 50 | C |
| Comparative sample 4 | 60 | C |
| Comparative sample 5 | 18 | C |
| Comparative sample 6 | 20 | C |
| Comparative sample 7 | 32 | C |
| Comparative sample 8 | 29 | C |
| Comparative sample 9 | 33 | C |
| Comparative sample 10 | 25 | C |
| Comparative sample 11 | 37 | C |

The results of Table 7 show that, in the fracture resistance test, each invention sample achieved grade "A" or "B", while each comparative sample achieved grade "C."

It is apparent from the above results that each invention sample has improved fracture resistance and accordingly has a long tool life.

Example 2

A machined cemented carbide insert with a shape of DMP120 (manufactured by Tungaloy Corporation) and a composition of 89.6% WC-9.8% Co-0.6% $Cr_3C_2$ (mass %) was prepared as a substrate. In a reactor of an arc ion plating apparatus, a metal evaporation source was arranged so as to achieve the composition of each layer shown in Table 8. The prepared substrate was fixed to a fixation fitting of a rotating table in the reactor.

Thereafter, the reactor was evacuated until the pressure therein indicated a vacuum of $5.0 \times 10^{-3}$ Pa or lower. After the evacuation, the substrate was heated, by a heater in the reactor, until the temperature reached 450° C. After the heating, an Ar gas was introduced into the reactor such that the pressure therein was 2.7 Pa.

In the Ar gas atmosphere with a pressure of 2.7 Pa, a bias voltage of −400 V was applied to the substrate, and a current of 40 A was caused to flow through a tungsten filament in the reactor, whereby an ion bombardment process was carried out, with the Ar gas, on a surface of the substrate for 30 minutes. After the ion bombardment process, the reactor was evacuated until the pressure therein indicated a vacuum of $5.0 \times 10^{-3}$ Pa or lower.

As to invention samples 31, 32 and 34 to 44, after the evacuation, the substrate was heated until the temperature reached the temperature shown in Table 9 (temperature when the deposition was started), and a gas was introduced into the reactor such that the pressure therein was 3.0 Pa. Herein, as to invention samples 31, 32, 34 to 39 and 41 to 44, an $N_2$ gas was introduced as the gas, and, as to invention sample 40, a gas mixture of an $N_2$ gas and a $C_2H_2$ gas was introduced as the gas, at a volume ratio of 90:10. Thereafter, the bias voltage shown in Table 9 was applied to the substrate, and the metal evaporation source involving the composition shown in Table 8 was evaporated via an arc discharge with the arc current shown in Table 9, whereby the lower layer was formed.

Then, invention samples 31 to 33 each employed the same manufacturing conditions as those for the alternating laminate structure of invention sample 1, invention samples 34 to 36 each employed the same manufacturing conditions as those for the alternating laminate structure of invention sample 12, invention samples 37 to 40 each employed the same manufacturing conditions as those for the alternating laminate structure of invention sample 23, and invention samples 41 to 44 each employed the same manufacturing conditions as those for the alternating laminate structure of invention sample 27; then, the first composite nitride layers and the second composite nitride layers were formed on a surface of the lower layer in an alternating manner.

It should be noted that the sample number indicated regarding the alternating laminate structure of each of invention samples 31 to 44 in Table 8 indicates that the alternating laminate structure of each of invention samples 31 to 44 is the same as the alternating laminate structure for the relevant sample number. For instance, the alternating laminate structure of invention sample 31 is identical to the alternating laminate structure of invention sample 1.

Next, as to invention samples 32 to 34 and 36 to 44, after the evacuation, the substrate was heated until the temperature reached the temperature shown in Table 9 (temperature when the deposition was started), and a gas was introduced into the reactor such that the pressure therein reached the pressure shown in Table 9. Herein, as to invention samples 32 to 34, 36 and 38 to 44, an $N_2$ gas was introduced as the gas, and, as to invention sample 37, a gas mixture of an $N_2$ gas and a $C_2H_2$ gas was introduced as the gas at a volume ratio of 90:10. Thereafter, the bias voltage shown in Table 9 was applied to the substrate, and the metal evaporation source involving the composition shown in Table 8 was evaporated via an arc discharge with the arc current shown in Table 9, whereby the upper layer was formed.

After the formation of each layer with the predetermined average thickness shown in each of Tables 8 and 9 on the substrate surface, the heater was turned off, and the sample was taken out of the reactor after the temperature of the sample reached 100° C. or lower.

TABLE 8

| | Coating layer | | | | | | |
|---|---|---|---|---|---|---|---|
| | Lower layer | | Alternating laminate structure | | Upper layer | | Average thickness of entire |
| Sample No. | Composition | Average thickness (μm) | Sample No. | Average thickness (μm) | Composition | Average thickness (μm) | coating layer (μm) |
| Invention sample 31 | $(Ti_{0.40}Al_{0.60})N$ | 0.5 | Invention sample 1 | 3.0 | — | — | 3.5 |
| Invention sample 32 | $(Ti_{0.60}Al_{0.40})N$ | 1.0 | Invention sample 1 | 3.0 | $(Ti_{0.50}Al_{0.50})N$ | 0.3 | 4.3 |
| Invention sample 33 | — | — | Invention sample 1 | 3.0 | $(Ti_{0.50}Al_{0.30}Cr_{0.15}Si_{0.05})N$ | 3.0 | 6.0 |
| Invention sample 34 | TiN | 2.0 | Invention sample 12 | 3.0 | AlN | 1.0 | 6.0 |
| Invention sample 35 | $(Ti_{0.90}W_{0.10})N$ | 3.0 | Invention sample 12 | 3.0 | — | — | 6.0 |
| Invention sample 36 | $(Ti_{0.50}Al_{0.30}Cr_{0.15}Si_{0.05})N$ | 0.5 | Invention sample 12 | 3.0 | $(Ti_{0.60}Al_{0.40})N$ | 2.5 | 6.0 |
| Invention sample 37 | $(Ti_{0.70}Al_{0.20}W_{0.10})N$ | 1.0 | Invention sample 23 | 2.0 | TiCN | 1.5 | 4.5 |
| Invention sample 38 | $(Ti_{0.60}Al_{0.35}Y_{0.05})N$ | 0.5 | Invention sample 23 | 2.0 | $(Ti_{0.80}Nb_{0.20})N$ | 1.0 | 3.5 |
| Invention sample 39 | AlN | 2.0 | Invention sample 23 | 2.0 | $(Ti_{0.90}Nb_{0.10})N$ | 0.3 | 4.3 |
| Invention sample 40 | TiCN | 1.0 | Invention sample 23 | 2.0 | $(Ti_{0.40}Al_{0.40}Nb_{0.20})N$ | 1.0 | 4.0 |
| Invention sample 41 | $(Ti_{0.50}Al_{0.50})N$ | 0.5 | Invention sample 27 | 6.0 | TiN | 0.5 | 7.0 |

TABLE 8-continued

| | Coating layer | | | | | | |
|---|---|---|---|---|---|---|---|
| | Lower layer | | Alternating laminate structure | | Upper layer | | Average thickness of entire coating layer (μm) |
| Sample No. | Composition | Average thickness (μm) | Sample No. | Average thickness (μm) | Composition | Average thickness (μm) | |
| Invention sample 42 | $(Ti_{0.50}Al_{0.40}Si_{0.10})N$ | 0.5 | Invention sample 27 | 6.0 | $(Ti_{0.90}W_{0.10})N$ | 0.5 | 7.0 |
| Invention sample 43 | $(Ti_{0.90}W_{0.10})N$ | 0.5 | Invention sample 27 | 6.0 | $(Ti_{0.50}Al_{0.40}Si_{0.10})N$ | 0.5 | 7.0 |
| Invention sample 44 | $(Ti_{0.50}Al_{0.40}Ta_{0.10})N$ | 0.5 | Invention sample 27 | 6.0 | AlN | 1.0 | 7.5 |

TABLE 9

| Sample No. | Deposition temperature (° C.) | Pressure (Pa) | Bias voltage (V) | Arc current (A) |
|---|---|---|---|---|
| Invention sample 31 | 500 | 3.0 | −60 | 150 |
| Invention sample 32 | 500 | 3.0 | −60 | 150 |
| Invention sample 33 | 500 | 3.0 | −60 | 150 |
| Invention sample 34 | 500 | 3.0 | −40 | 150 |
| Invention sample 35 | 500 | 3.0 | −40 | 150 |
| Invention sample 36 | 500 | 3.0 | −40 | 150 |
| Invention sample 37 | 400 | 3.0 | −60 | 150 |
| Invention sample 38 | 400 | 3.0 | −60 | 150 |
| Invention sample 39 | 400 | 3.0 | −60 | 150 |
| Invention sample 40 | 400 | 3.0 | −60 | 150 |
| Invention sample 41 | 500 | 3.0 | −80 | 150 |
| Invention sample 42 | 500 | 3.0 | −80 | 150 |
| Invention sample 43 | 500 | 3.0 | −80 | 150 |
| Invention sample 44 | 500 | 3.0 | −80 | 150 |

As to the average thickness of each layer of each of the obtained samples, such average thickness was obtained by: measuring the thickness of each layer via a TEM observation of each of the cross-sectional surfaces at three locations near the position 50 μm from the edge of a surface facing the metal evaporation source of the coated cutting tool, toward the center of such surface; and calculating the average value (arithmetic mean) of the resulting measurements. The results are shown in Table 8.

The composition of each layer of the obtained sample was measured from the cross-sectional surface near the position at most 50 μm from the edge of a surface facing the metal evaporation source of the coated cutting tool, toward the center of such surface, using an EDS attached to a TEM. The measurement results are shown in Table 8. It should be noted that the composition ratio of the metal elements of each layer in Table 8 refers to an atomic ratio of each metal element relative to all the metal elements in the metal compound which constitutes each layer.

The characteristics of the alternating laminate structure of each of invention samples 31 to 44, i.e., the hardness H, the elastic modulus E, the H/E, the I(200)/I(111) in the second composite nitride layer, the FWHM (°) for a (200) plane therein and the average thickness were the same as the characteristics of the alternating laminate structure of the sample number indicated for the relevant alternating laminate structure.

Using the obtained samples, the same cutting test as in Example 1 was conducted in order to perform evaluations. As to the machining length to reach the end of the tool life in the test on fracture resistance, evaluations were made with grade "A" for 100 m or more, grade "B" for 70 m or more and less than 100 m, and grade "C" for less than 70 m. In such evaluations, "A" refers to excellent, "B" refers to good and "C" refers to inferior, meaning that a sample involving a larger number of grade "A"s or "B"s has more excellent cutting performance. More specifically, a long machining length indicates excellent fracture resistance and wear resistance. The evaluation results are shown in Table 10.

TABLE 10

| | Cutting test | |
|---|---|---|
| Sample No. | Machining length (m) | Grade |
| Invention sample 31 | 152 | A |
| Invention sample 32 | 158 | A |
| Invention sample 33 | 167 | A |
| Invention sample 34 | 142 | A |
| Invention sample 35 | 149 | A |
| Invention sample 36 | 155 | A |
| Invention sample 37 | 121 | A |
| Invention sample 38 | 114 | A |
| Invention sample 39 | 118 | A |
| Invention sample 40 | 120 | A |
| Invention sample 41 | 136 | A |
| Invention sample 42 | 138 | A |
| Invention sample 43 | 138 | A |
| Invention sample 44 | 139 | A |

The results of Table 10 show that, in the fracture resistance test, each invention sample achieved grade "A."

Accordingly, it is apparent that each invention sample has excellent fracture resistance and accordingly has a long tool life, even if it includes the upper layer and/or the lower layer.

INDUSTRIAL APPLICABILITY

The coated cutting tool according to the present invention has excellent fracture resistance, whereby the tool life can be extended more than that involved in the prior art, and the coated cutting tool therefore has high industrial applicability.

REFERENCE SIGNS LIST

1: Substrate, 2: Lower layer, 3: First composite nitride layer, 4: Second composite nitride layer, 5: Upper layer, 6: Alternating laminate structure, 7: Coating layer, 8: Coated cutting tool.

What is claimed is:

1. A coated cutting tool comprising a substrate and a coating layer formed on the substrate, wherein:
   the coating layer has an alternating laminate structure of an alternating laminate of:
   a first composite nitride layer containing a compound having a composition represented by formula (1) below:

$$(Al_{1-x}Cr_x)N \quad (1)$$

wherein x denotes an atomic ratio of the Cr element based on a total of the Al element and the Cr element and satisfies $0.10 \leq x \leq 0.50$; and
   a second composite nitride layer containing a compound having a composition represented by formula (2) below:

$$(Ti_{1-y}Si_y)N \quad (2)$$

wherein y denotes an atomic ratio of the Si element based on a total of the Ti element and the Si element and satisfies $0.00 < y \leq 0.40$;
   an average thickness of each of the layers of the first composite nitride layer is from 70 nm or more to 300 nm or less, and an average thickness of each of the layers of the second composite nitride layer is from 70 nm or more to 300 nm or less; and
   a ratio H/E of a hardness H (unit: GPa) of the alternating laminate structure to an elastic modulus E (unit: GPa) of the alternating laminate structure is from 0.060 or more to 0.080 or less.

2. The coated cutting tool according to claim 1, wherein, in formula (2), y satisfies $0.05 \leq y \leq 0.30$.

3. The coated cutting tool according to claim 1, wherein the hardness H of the alternating laminate structure is from 33 GPa or higher to 40 GPa or lower.

4. The coated cutting tool according to claim 1, wherein the elastic modulus E of the alternating laminate structure is from 500 GPa or higher to 550 GPa or lower.

5. The coated cutting tool according to claim 1, wherein the second composite nitride layer comprises a cubic crystal system, and a ratio I(200)/I(111) of a peak intensity I(200) for a (200) plane of the second composite nitride layer to a peak intensity I(111) for a (111) plane of the second composite nitride layer in an X-ray diffraction analysis is from 1.0 or more to 20 or less.

6. The coated cutting tool according to claim 1, wherein, in the second composite nitride layer, a full width at half maximum (FWHM) for a (200) plane in X-ray diffraction is from 0.4° or more to 1.0° or less.

7. The coated cutting tool according to claim 1, wherein an average thickness of the alternating laminate structure is from 1.50 μm or more to 12.00 μm or less.

8. The coated cutting tool according to claim 1, wherein:
   the coating layer includes a lower layer between the substrate and the alternating laminate structure;
   the lower layer is comprised of a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and
   an average thickness of the lower layer is from 0.1 μm or more to 3.5 μm or less.

9. The coated cutting tool according to claim 1, wherein:
   the coating layer includes an upper layer on a surface of the alternating laminate structure;
   the upper layer is comprised of a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and
   an average thickness of the upper layer is from 0.1 μm or more to 3.5 μm or less.

10. The coated cutting tool according to claim 1, wherein an average thickness of the coating layer in its entirety is from 1.5 μm or more to 15.0 μm or less.

11. The coated cutting tool according to claim 1, wherein the substrate is a cemented carbide, cermet, ceramic or a cubic boron nitride sintered body.

12. The coated cutting tool according to claim 2, wherein the hardness H of the alternating laminate structure is from 33 GPa or higher to 40 GPa or lower.

13. The coated cutting tool according to claim 2, wherein the elastic modulus E of the alternating laminate structure is from 500 GPa or higher to 550 GPa or lower.

14. The coated cutting tool according to claim 3, wherein the elastic modulus E of the alternating laminate structure is from 500 GPa or higher to 550 GPa or lower.

15. The coated cutting tool according to claim 12, wherein the elastic modulus E of the alternating laminate structure is from 500 GPa or higher to 550 GPa or lower.

16. The coated cutting tool according to claim 2, wherein the second composite nitride layer comprises a cubic crystal system, and a ratio I(200)/I(111) of a peak intensity I(200) for a (200) plane of the second composite nitride layer to a peak intensity I(111) for a (111) plane of the second composite nitride layer in an X-ray diffraction analysis is from 1.0 or more to 20 or less.

17. The coated cutting tool according to claim 3, wherein the second composite nitride layer comprises a cubic crystal system, and a ratio I(200)/I(111) of a peak intensity I(200) for a (200) plane of the second composite nitride layer to a peak intensity I(111) for a (111) plane of the second composite nitride layer in an X-ray diffraction analysis is from 1.0 or more to 20 or less.

18. The coated cutting tool according to claim 4, wherein the second composite nitride layer comprises a cubic crystal system, and a ratio I(200)/I(111) of a peak intensity I(200) for a (200) plane of the second composite nitride layer to a peak intensity I(111) for a (111) plane of the second composite nitride layer in an X-ray diffraction analysis is from 1.0 or more to 20 or less.

19. The coated cutting tool according to claim 12, wherein the second composite nitride layer comprises a cubic crystal system, and a ratio I(200)/I(111) of a peak intensity I(200)

for a (200) plane of the second composite nitride layer to a peak intensity I(111) for a (111) plane of the second composite nitride layer in an X-ray diffraction analysis is from 1.0 or more to 20 or less.

20. The coated cutting tool according to claim 13, wherein the second composite nitride layer comprises a cubic crystal system, and a ratio I(200)/I(111) of a peak intensity I(200) for a (200) plane of the second composite nitride layer to a peak intensity I(111) for a (111) plane of the second composite nitride layer in an X-ray diffraction analysis is from 1.0 or more to 20 or less.

* * * * *